(12) United States Patent
Toothaker et al.

(10) Patent No.: US 10,765,024 B2
(45) Date of Patent: Sep. 1, 2020

(54) HINGED CHASSIS WITH A UNIFORM STRESS HINGE

(71) Applicant: Microsoft Technology Licensing, LLC, Redmond, WA (US)

(72) Inventors: Brady James Toothaker, Longmont, CO (US); Bradley Edgar Clements, Fort Collins, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/224,753

(22) Filed: Dec. 18, 2018

(65) Prior Publication Data

US 2020/0196468 A1    Jun. 18, 2020

(51) Int. Cl.
*H05K 5/02* (2006.01)
*G06F 3/0354* (2013.01)
*G01D 11/20* (2006.01)

(52) U.S. Cl.
CPC .......... *H05K 5/0226* (2013.01); *G01D 11/20* (2013.01); *G06F 3/03545* (2013.01)

(58) Field of Classification Search
CPC ...... H05K 5/0226; H05K 5/0017; H05K 5/03; G06F 3/03545; G01D 11/20; H02G 15/18; H02G 15/113
See application file for complete search history.

(56) References Cited

U.S. PATENT DOCUMENTS

| | | | | |
|---|---|---|---|---|
| 3,183,302 | A * | 5/1965 | Wochner | H01R 4/20 174/138 F |
| 3,846,725 | A * | 11/1974 | Mears, Jr. | H01F 5/02 336/92 |
| 5,191,172 | A * | 3/1993 | Garganese | H02G 15/043 174/138 F |
| 5,434,362 | A | 7/1995 | Klosowiak et al. | |
| 5,614,694 | A | 3/1997 | Gorenz et al. | |
| 5,796,041 | A * | 8/1998 | Suzuki | H02G 15/18 174/92 |
| 6,359,228 | B1 | 3/2002 | Strause et al. | |
| 6,897,371 | B1 | 5/2005 | Kurz et al. | |

(Continued)

OTHER PUBLICATIONS

Kanji, Muhammad JAR., "Surface Patents Show Microsoft's Novel Approach to Pen Storage", Retrieved From: https://www.neowin.net/amp/surface-patents-show-microsofts-novel-approach-to-pen-storage, Sep. 24, 2017, 6 pages.

(Continued)

*Primary Examiner* — Abhishek M Rathod
(74) *Attorney, Agent, or Firm* — Ray Quinney & Nebeker P.C.; Paul N. Taylor

(57) ABSTRACT

An electronic device has a chassis with an open state and a closed state. The chassis has a first portion, a second portion, and a perforated hinge. The first portion has a first outer edge and a first inner edge. The second portion has a second outer edge and a second inner edge. The perforated hinge has a plurality of perforations. The perforated hinge is positioned between the first portion and the second portion at the first inner edge and the second inner edge. The first portion, the second portion, and the perforated hinge are integrally formed from a continuous piece and the perforated hinge is deformable to mate the first outer edge to the second outer edge in the closed state.

22 Claims, 8 Drawing Sheets

(56) References Cited

U.S. PATENT DOCUMENTS

| | | | |
|---|---|---|---|
| 6,905,450 B2 | 6/2005 | Sullivan | |
| 8,022,327 B2 | 9/2011 | Blomeyer | |
| 9,518,768 B2 | 12/2016 | Vreeland et al. | |
| 9,703,401 B2 | 7/2017 | Chang | |
| 9,721,703 B2* | 8/2017 | Hiller | H01B 17/00 |
| 2007/0137882 A1* | 6/2007 | Journeaux | H02G 3/32 |
| | | | 174/135 |
| 2010/0316347 A1* | 12/2010 | Kowalczyk | G02B 6/4465 |
| | | | 385/136 |
| 2012/0267276 A1* | 10/2012 | Hunter | B42D 15/045 |
| | | | 206/449 |
| 2013/0312369 A1* | 11/2013 | Maki | B65D 5/542 |
| | | | 53/456 |
| 2015/0049428 A1* | 2/2015 | Lee | G06F 1/1652 |
| | | | 361/679.27 |
| 2015/0062094 A1 | 3/2015 | Ryshtun et al. | |
| 2015/0212605 A1 | 7/2015 | Lien | |
| 2015/0373867 A1 | 12/2015 | Reyes et al. | |
| 2016/0078984 A1* | 3/2016 | Wieneke | H01B 7/368 |
| | | | 174/112 |
| 2017/0269718 A1* | 9/2017 | Barel | G06F 3/03545 |
| 2018/0097197 A1* | 4/2018 | Han | G06F 1/1626 |
| 2018/0102496 A1* | 4/2018 | Kim | H01L 23/552 |
| 2018/0222142 A1* | 8/2018 | Hsi-Chang | B32B 37/06 |

OTHER PUBLICATIONS

"International Search Report and Written Opinion Issued in PCT Application No. PCT/US19/064337", dated Mar. 12, 2020, 21 Pages.

\* cited by examiner

HINGED CHASSIS WITH A UNIFORM STRESS HINGE

CROSS-REFERENCE TO RELATED APPLICATIONS

N/A

BACKGROUND OF THE DISCLOSURE

Portable electronic devices package electronic components in a small volume. A chassis that supports the electronic components can support electronic components inside or outside of the chassis. For components inside of the chassis, the volume and dimensions of the interior space can determine what electronic components can be used in the electronic device. Increasing the volume of the interior space while maintaining strength of the chassis is desirable. Additionally, the electronic components of the device generate electromagnetic interference (EMI) that can affect the operation of other components. Conventionally, a separate EMI shield is provided around the interior space, but this separate shield consumes valuable space inside the device. Providing EMI shielding with the chassis can save space in the device.

SUMMARY

In some implementations, an electronic device has a chassis with an open state and a closed state. The chassis has a first portion, a second portion, and a perforated hinge. The first portion has a first outer edge and a first inner edge. The second portion has a second outer edge and a second inner edge. The perforated hinge has a plurality of perforations. The perforated hinge is positioned between the first portion and the second portion at the first inner edge and the second inner edge. The first portion, the second portion, and the perforated hinge are integrally formed from a continuous piece and the perforated hinge is deformable to mate the first outer edge to the second outer edge in the closed state.

In some implementations, an electronic stylus has a chassis, a force sensor supported by the chassis, and a communication device supported by the chassis. The chassis has a first portion, a second portion, and a perforated hinge. The first portion has a first outer edge and a first inner edge. The second portion has a second outer edge and a second inner edge. The perforated hinge has a plurality of perforations. The perforated hinge is positioned between the first portion and the second portion at the first inner edge and the second inner edge. The first portion, the second portion, and the perforated hinge are integrally formed from a continuous piece and the first outer edge and the second outer edge are connected to one another in the closed state. A hinge height defines the chassis height.

In some implementations, a method of manufacturing an electronic device includes forming a chassis from a single piece of deformable material, positioning at least one electronic component on a surface of the chassis, and folding the chassis along a perforated hinge to close the chassis around the electronic component such that the perforated hinge has a controlled radius of curvature.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of implementations of the disclosure will be set forth in the description which follows, and in part will be obvious from the description, or may be learned by the practice of such implementations. The features and advantages of such implementations may be realized and obtained by means of the instruments and combinations particularly pointed out in the appended claims. These and other features will become more fully apparent from the following description and appended claims or may be learned by the practice of such implementations as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 1-2 is a perspective view of an electronic device with the chassis of FIG. 1-1;

FIG. 2 is an end view of an electronic device with a chassis;

FIG. 8-1 is an end view of an electronic device with a chassis in an open state;

FIG. 8-2 is a perspective view of the electronic device of FIG. 8-1 with the chassis in a partially closed state;

FIG. 8-3 is an end view of the electronic device of FIG. 8-1 with the chassis in a closed state.

DETAILED DESCRIPTION

This disclosure generally relates to devices, systems, and methods for supporting an electronic device. More particularly, the present disclosure relates to a hinged chassis for an electronic device that provides improved internal volume, improved strength, and improved electromagnetic interference protection. The chassis is a single integral (e.g., continuous) piece of deformable material that is hinged to provide a clamshell enclosure for electronic components. The chassis has an open state and a closed state. The chassis supports electronic components in an interior space and on exterior surfaces in the closed state.

The chassis, in at least one implementation, has a perforated hinge. In some implementations, a perforated hinge may provide the chassis with a uniform radius of curvature across the hinge in the closed state. A uniform radius of curvature can improve the usability of the interior space for housing and supporting components of the electronic device. The perforated hinge may provide the chassis with uniform surface stress in the closed state.

Figure 1:
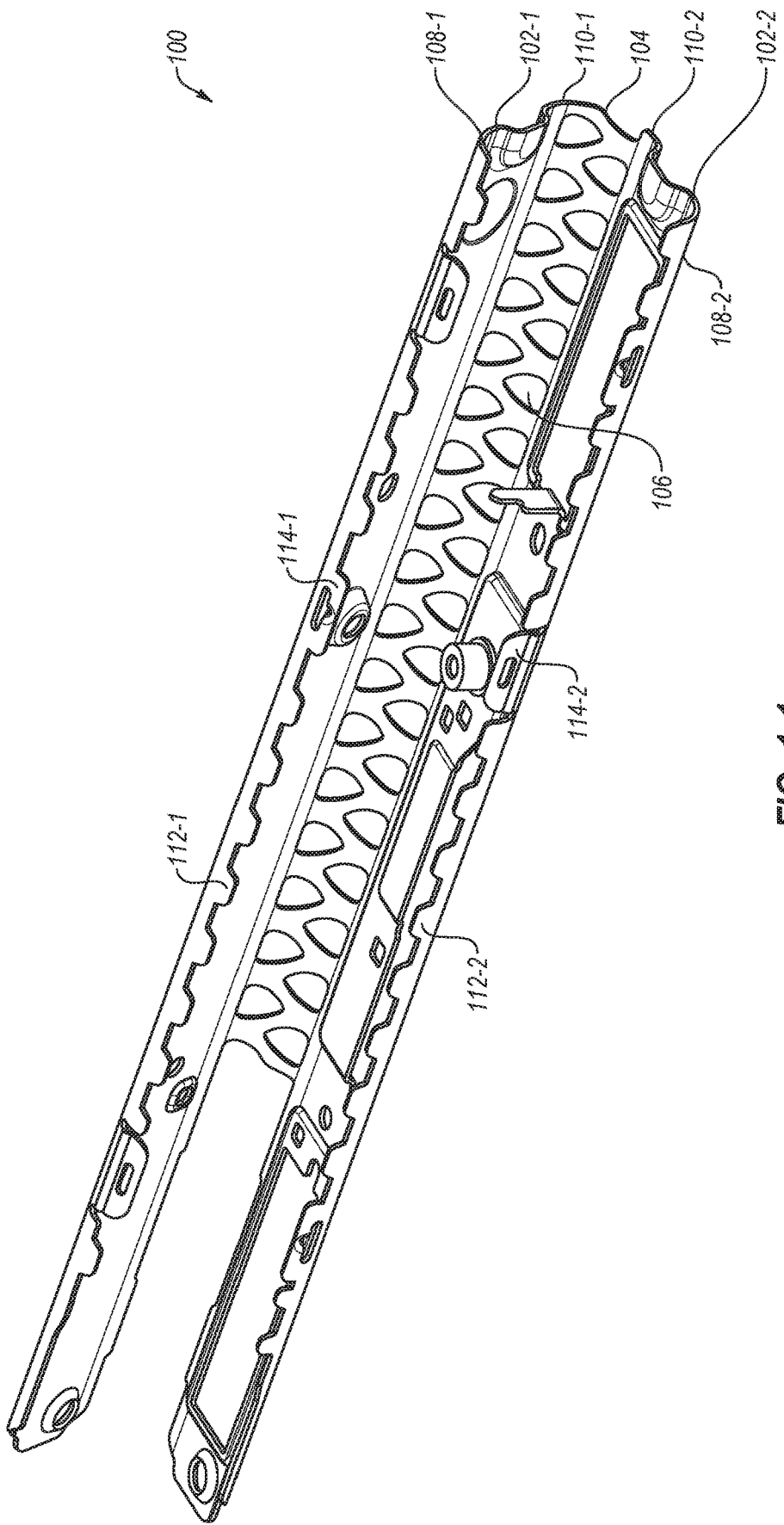
FIG. 1-1 is a perspective view of a chassis.
Figures 1, 2:
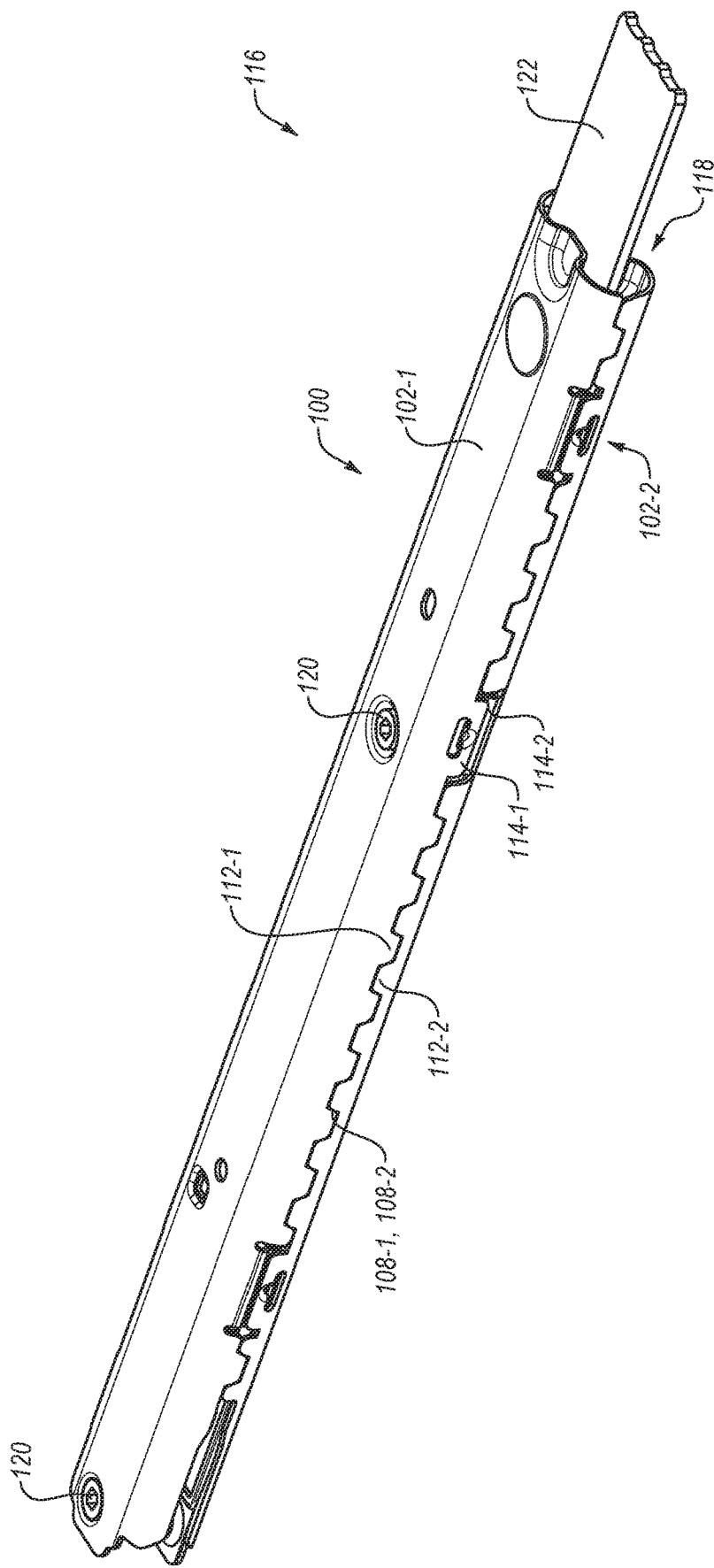
Figure 2:
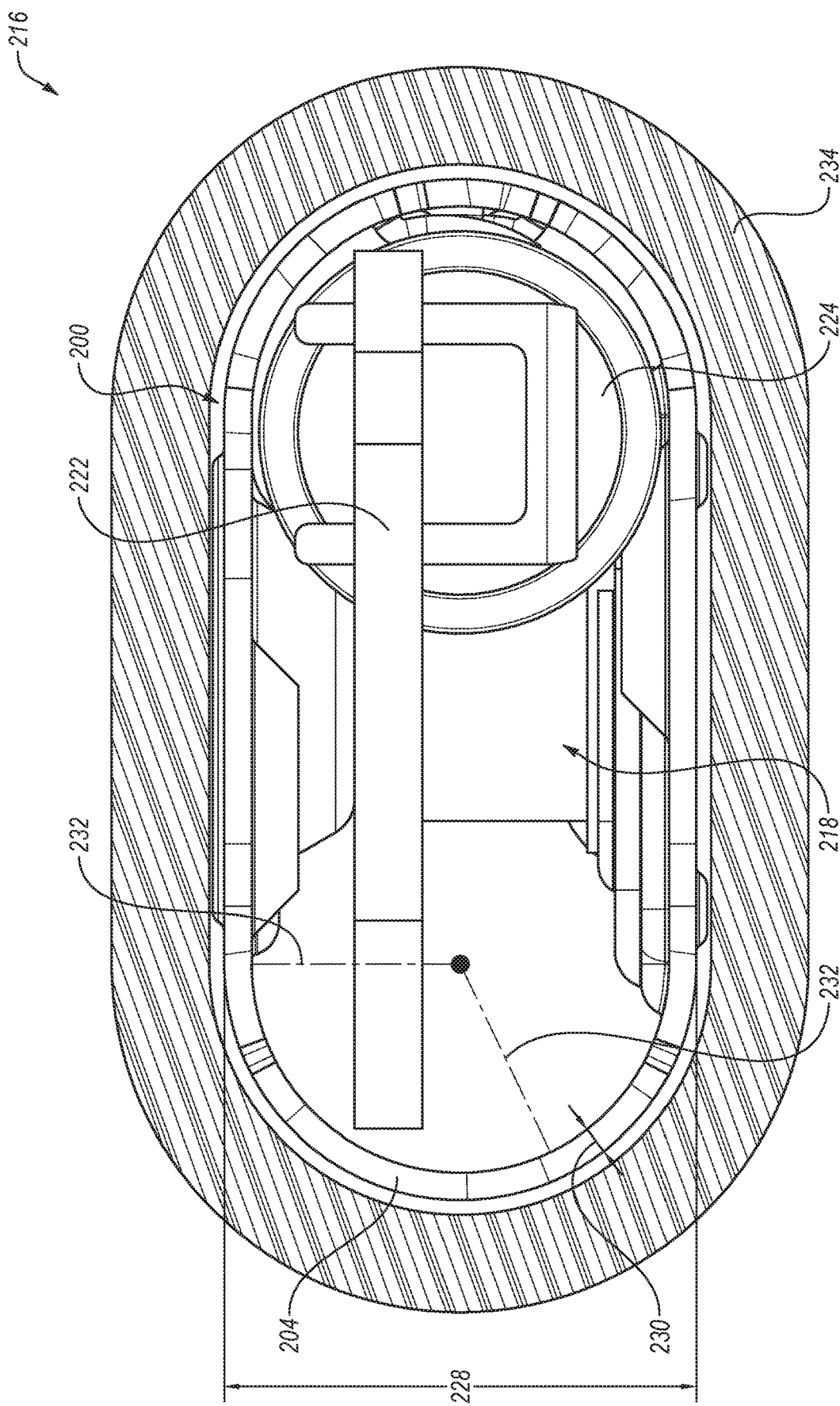

FIG. 1-1 and FIG. 1-2 illustrate an implementation of a chassis 100 in an open state and a closed state, respectively. The chassis 100 is made of a deformable material in a single piece, as described herein. In some implementations, the chassis 100 is made of a plastically deformable metal. For example, the chassis 100 may be made of a steel alloy. In at least one example, the chassis 100 may be a stainless steel alloy. In other examples, the chassis 100 may be an aluminum alloy. In further examples, the chassis 100 may be a titanium alloy.

The chassis 100 has a first portion 102-1 and a second portion 102-2 that are connected by a hinge 104 positioned between at least part of the first portion 102-1 and the second portion 102-2. In some implementations, the hinge 104 connects at least 50% of the axial length (i.e., the direction of the axis of the hinge 104) of the first portion 102-1 and/or second portion 102-2. In other implementations, the hinge 104 connects at least 75% of the axial length of the first portion 102-1 and/or second portion 102-2. In yet other implementations, the hinge 104 connects the entire axial length of the first portion 102-1 and/or second portion 102-2.

The hinge 104 of the chassis 100 is perforated with a plurality of perforations 106. In some implementations, the perforations 106 are sized, shaped, and positioned to provide a uniform radius of curvature across the hinge 104 in the closed state. For example, a uniform radius of curvature may be a radius of curvature that varies by less than 10% across at least 90% of the area of the hinge 104. In other examples, a uniform radius of curvature may be a radius of curvature that varies by less than 10% across at least 95% of the area of the hinge 104. In yet other examples, a uniform radius of curvature may be a radius of curvature that varies by less than 10% across the entire area of the hinge 104. In further examples, a uniform radius of curvature may be a radius of curvature that varies by less than 5% across at least 90% of the area of the hinge 104. In yet further examples, a uniform radius of curvature may be a radius of curvature that varies by less than 1% across at least 90% of the area of the hinge 104. In still further examples, a uniform radius of curvature may be a radius of curvature that varies by less than 5% across at least 95% of the area of the hinge 104. In at least one example, it may be critical that a uniform radius of curvature may be a radius of curvature that varies by less than 5% across the entire area of the hinge 104.

In other implementations, the perforations 106 are sized, shaped, and positioned to provide a uniform surface stress across the hinge 104 in the closed state. For example, a uniform surface stress may be a surface stress that varies by less than 10% across at least 90% of the area of the hinge 104. In other examples, a uniform surface stress may be a surface stress that varies by less than 10% across at least 95% of the area of the hinge 104. In yet other examples, a uniform surface stress may be a surface stress that varies by less than 10% across the entire area of the hinge 104. In further examples, a uniform surface stress may be a surface stress that varies by less than 5% across at least 90% of the area of the hinge 104. In yet further examples, a uniform surface stress may be a surface stress that varies by less than 1% across at least 90% of the area of the hinge 104. In still further examples, a uniform surface stress may be a surface stress that varies by less than 5% across at least 95% of the area of the hinge 104. In at least one example, a unif uniform surface stress may be a surface stress that varies by less than 5% across the entire area of the hinge 104.

In yet other implementations, the perforations 106 are sized, shaped, and positioned to provide a uniform internal stress across the hinge 104 in the closed state. For example, a uniform internal stress may be an internal stress that varies by less than 10% across at least 90% of the area of the hinge 104. In other examples, a uniform internal stress may be an internal stress that varies by less than 10% across at least 95% of the area of the hinge 104. In yet other examples, a uniform internal stress may be an internal stress that varies by less than 10% across the entire area of the hinge 104. In further examples, a uniform internal stress may be an internal stress that varies by less than 5% across at least 90% of the area of the hinge 104. In yet further examples, a uniform internal stress may be an internal stress that varies by less than 1% across at least 90% of the area of the hinge 104. In still further examples, a uniform internal stress may be an internal stress that varies by less than 5% across at least 95% of the area of the hinge 104. In at least one example, a uniform internal stress may be an internal stress that varies by less than 5% across the entire area of the hinge 104.

The first portion 102-1 has a first outer edge 108-1 and a first inner edge 110-1. The second portion 102-2 has a second outer edge 108-2 and a second inner edge 110-2. The hinge 104 connects to the first portion 102-1 along the first inner edge 110-1 and to the second portion 102-2 along the second inner edge 110-2. The first outer edge 108-1 and second outer edge 108-2 are configured to contact when in the closed state. In some implementations, the first outer edge 108-1 and second outer edge 108-2 have complementary alignment features 112-1, 112-2 and/or complementary connection features 114-1, 114-2.

Referring now to FIG. 1-2, the chassis 100 provides strength and durability to an electronic device 116. In the closed state, the first portion 102-1 and second portion 102-2 may remain rigid as the hinge 104 deforms to allow the first outer edge 108-1 and second outer edge 108-2 to contact one another. In some examples, a rigid first portion 102-1 and/or second portion 102-2 may deform less than 10% across at least 90% of the area of the first portion 102-1 and/or second portion 102-2. In other examples, a rigid first portion 102-1 and/or second portion 102-2 may deform less than 10% across at least 95% of the area of the first portion 102-1 and/or second portion 102-2. In yet other examples, a rigid first portion 102-1 and/or second portion 102-2 may deform less than 10% across the entire area of the first portion 102-1 and/or second portion 102-2. In further examples, a rigid first portion 102-1 and/or second portion 102-2 may deform less than 5% across at least 90% of the area of the first portion 102-1 and/or second portion 102-2. In yet further examples, a rigid first portion 102-1 and/or second portion 102-2 may deform less than 5% across at least 95% of the area of the first portion 102-1 and/or second portion 102-2. In at least one example, a rigid first portion 102-1 and/or second portion 102-2 may deform less than 5% across the entire area of the first portion 102-1 and/or second portion 102-2.

The plurality of complementary connection features 114-1, 114-2 connect and hold the first portion 102-1 in contact with the second portion 102-2. In some implementations, the complementary connection features 114-1, 114-2 include or are mechanical connection features that connect and hold by a friction fit, a snap fit, a press fit, a deformable tab and slot, other mechanical connections, or combinations thereof. In other implementations, the complementary connection features 114-1, 114-2 include a mechanical fastener such as a pin, rod, bolt, clip, clamp, other mechanical fasteners, or combinations thereof. In yet other implementations, the complementary connection features 114-1, 114-2 include additional connection support, such as welding, brazing, adhesives, or combinations thereof. For example, the complementary connection features 114-1, 114-2 may include a slot and tab that snap together, and the slot and tab may be subsequently welded to further support the complementary connection features 114-1, 114-2.

In some implementations, the plurality of complementary alignment features 112-1, 112-2 engage with one another along at least a portion of the first outer edge 108-1 and second outer edge 108-2 to align the first portion 102-1 and second portion 102-2 in the closed state. The complementary alignment features 112-1, 112-2 can limit and/or prevent the movement of the first portion 102-1 and second portion 102-2 relative to one another during use and/or transport of the electronic device. For example, the complementary alignment features 112-1, 112-2 may be a series of castellations that engage with one another and to both align and prevent axial movement of the first portion 102-1 and second portion 102-2 relative to one another, such as during three-point bending of the chassis 100.

In the closed state, the chassis 100 defines an interior space 118 between the first portion 102-1 and second portion 102-2. In some implementations, the chassis 100 has a plurality of fasteners 120 that are positioned through at least a portion of the interior space 118 to apply a compressive force and retain the chassis 100 in the closed state. The interior space 118 allows the chassis 100 to support and house one or more electronic components, such as a printed circuit board (PCB) 122 including a force sensor that may measure force applied to an end of the electronic device 116.

FIG. 2 is a cross-sectional view of an electronic device 216 with a chassis 200. In some implementations, the electronic device 216 is a stylus. The stylus includes the chassis 200 with a PCB 222 and a battery 224 housed in the interior space 218. The volume of the interior space 218 is partially determined by a chassis height 228 and a chassis thickness 230. In some implementations, the chassis height 228 is the same as a hinge height. In other implementations, the chassis height 228 may be greater than the hinge height.

In some implementations, the chassis thickness 230 is substantially constant through chassis 100. In other implementations, the chassis thickness 230 is smaller in the hinge 204. For example, the chassis thickness 230 may decrease in at least a portion of the hinge 204 to aid in the deformation of the hinge 204 while a greater chassis thickness 230 in other areas of the chassis 200 may promote rigidity. In at least one example, such as a stylus, the chassis thickness 230 may be approximately 0.7 millimeters (mm) throughout the chassis 200. In at least another example, the chassis thickness may be approximately 0.5 mm throughout the hinge 204 and approximately 0.7 mm in the remainder of the chassis 200.

FIG. 2 illustrates an example of a hinge 204 with a uniform radius of curvature 232. As described herein, a hinge 204 may have some variation across the hinge 204 while still considered uniform. In the illustrated implementation of a stylus the radius of curvature 232 of the hinge 204 is approximately 2.5 mm. The hinge 204, therefore, has a 5.0 mm diameter, providing an interior space with a 5.0 mm height.

In some implementations, the chassis 200 provides the finished outer surface of the electronic device 216. In other implementations, an outer sleeve 234 is positioned over at least a portion of the chassis 200 to provide additional housing for electronic components, a different finish, various colorway options, or different surface textures to improve grip during use or transport. For example, the outer sleeve 234 may be a polymer that is softer and has a higher coefficient of friction than the chassis 200. The outer sleeve 234 may be more comfortable to hold and use for a user than the chassis 200 itself.

Figure 3:
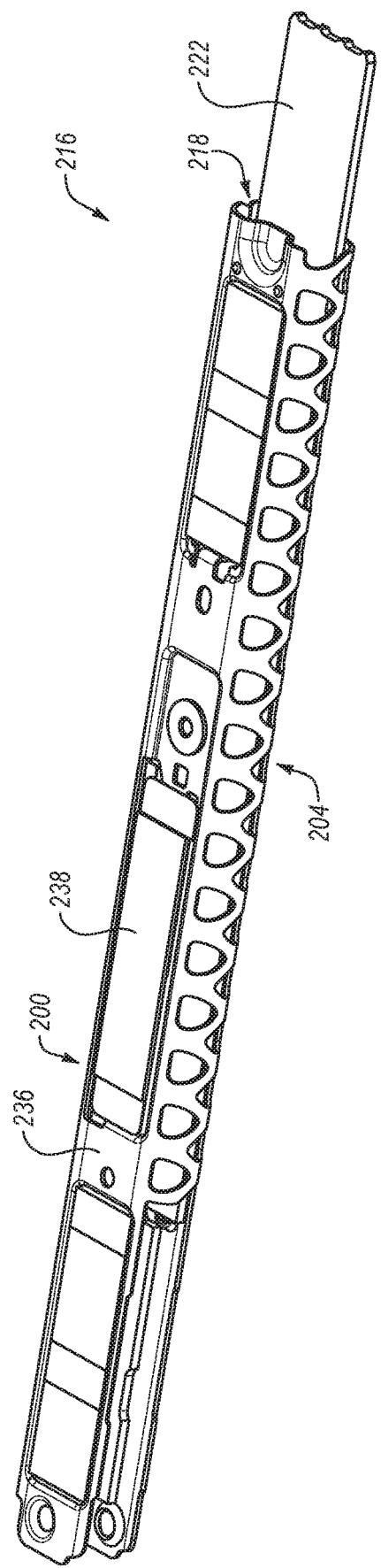
FIG. 3 is a perspective view of the electronic device of FIG. 2.

FIG. 3 is a perspective view of the electronic device 216 of FIG. 2. In some implementations, the electronic device 216 includes a plurality of electronic components positioned at least partially inside the interior space 218 of the chassis 200, such as the PCB 222, and at least one electronic component supported by an outer surface 236 of the chassis 200, such as a communication device 238. In some implementations, an electrically conductive chassis 200 forms a gaussian cage around the electronic components in the interior space 218. The gaussian cage can reduce electromagnetic interference (EMI) between the electronic components in the interior space 218 and the electronic components supported on the outer surface 236 of the chassis 200. In particular, a communication device 238 may experience less (EMI) with a chassis 200 according to at least one implementation described herein than some conventional chassis.

Figure 4:
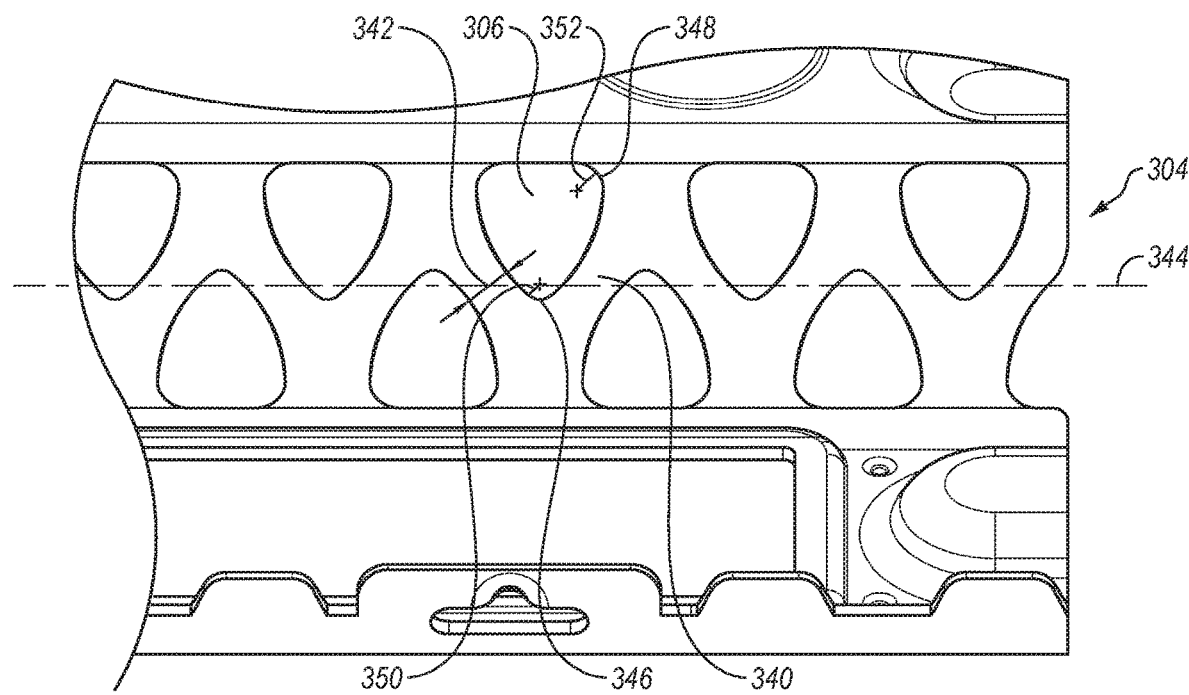
FIG. 4 is a detail view of a perforated hinge.

The hinge 204 has a plurality of perforations 206 therein that allow the hinge 204 to deform more easily than the rest of the chassis 200. FIG. 4 is a detail view of an implementation of a perforated hinge 304. In some implementations, the perforations 306 are sized, shaped, and positioned to provide a uniform radius of curvature, a uniform surface stress, a uniform internal stress, or combinations thereof. For example, the perforations 306 illustrated in FIG. 4 are sized, shaped, and positioned to provide struts 340 between the perforations 306 with a strut width 342 that is the same between each perforation 306 along longitudinal axis 344 of the hinge 304. In some implementations, the perforations 306 are positioned such that a portion of the perforations 306 overlap in the lateral direction. For example, each axial row of perforations 306 overlap the longitudinal axis 344, such that at least a portion of each perforation 306 laterally overlaps a portion of the axially neighboring perforation 306.

In some implementations, the perforations 306 are polygonal, such as triangles, diamonds, rectangles, squares, pentagons, hexagons, etc. In other implementations, the perforations 306 are round, such as circles, ovals, prolate ovals, or other shapes with continuous perimeters (i.e., no corners). In yet other implementations, the perforations 306 are a combination, such as a rounded polygon.

In some implementations, the perforations 306 are rounded triangles (i.e., guitar-pick shaped). Rounded triangle perforations 306 yield struts 340 therebetween that are arranged in triangles, providing high strength and low weight. The radius of curvature of the rounded corner can be different in different regions of the hinge 304 to account for different forces at different points of the hinge 304. For example, the rounded triangle perforations 306 of the implementation in FIG. 4 have a forward point 346 and rearward points 348 with different minimum radii of curvature. The forward point 346 has a first minimum radius of curvature 350 that is less than the second minimum radius of curvature 352 of the rearward points 348.

In some implementations, the perforation 306 has a first minimum radius of curvature 350 of between 0.05 mm and 0.5 mm. In other implementations, the perforation 306 has a first minimum radius of curvature 350 of between 0.1 mm and 0.3 mm. In at least one implementation, the perforation 306 has a first minimum radius of curvature 350 of about 0.2 mm.

In some implementations, the perforation 306 has a second minimum radius of curvature 352 of between 0.25 mm and 0.75 mm. In other implementations, the perforation 306 has a second minimum radius of curvature 352 of between 0.3 mm and 0.7 mm. In at least one implementation, the perforation 306 has a second minimum radius of curvature 352 of about 0.5 mm.

Figure 5:
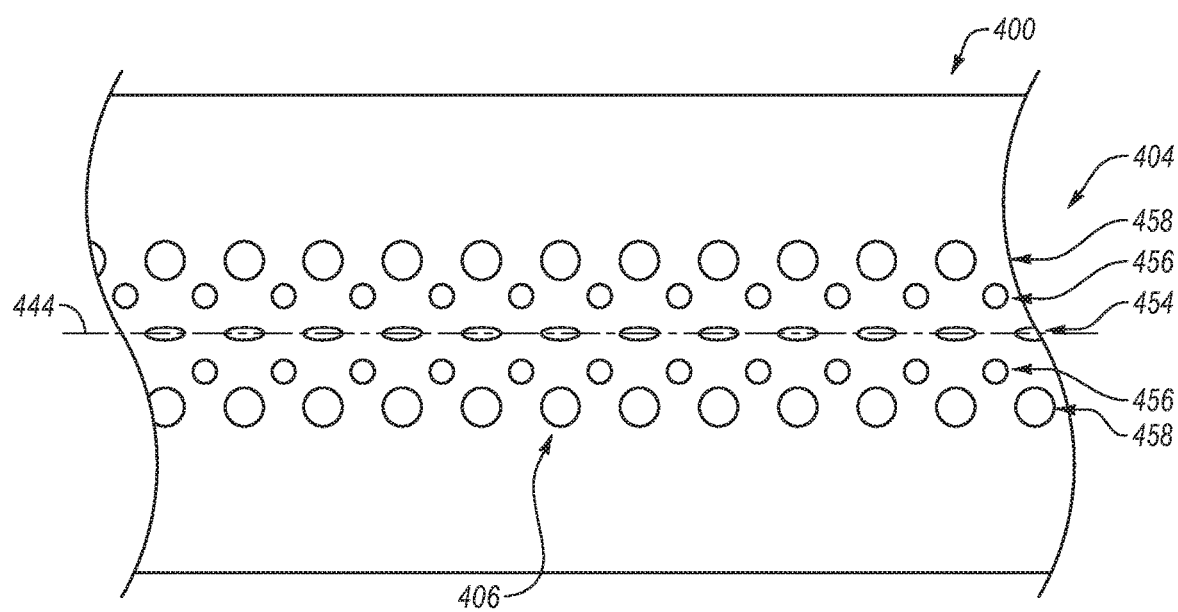
FIG. 5 is a flat view of another perforated hinge.

In other implementations, the perforations of the hinge vary in size, shape, position, or combinations thereof to provide a uniform radius of curvature, a uniform surface stress, a uniform internal stress, or both. FIG. 5 is a flat view of an implementation of a chassis 400 with a hinge 404 having perforations 406 that vary in area, shape, and spacing relative to a longitudinal axis 444 of the hinge 404.

The perforations 406 may vary according to a lateral distance from the longitudinal axis 444. In some implementations, the perforations 406 include at least a center row 454. In other implementations, the perforations 406 include at least a center row 454 and secondary rows 456 on either side of the center row 454. In yet other implementations, the perforations 406 include at least a center row 454, secondary rows 456, and tertiary rows 458 on either side of the center row 454.

In some implementations, the perforations 406 of the center row 454 are the same along the longitudinal axis 444. For example, the perforations 406 of the center row 454 may be all the same shape and size, such as illustrated in FIG. 5. In other implementations, the perforations 406 of the center row 454 vary along the longitudinal axis 444. For example, the perforations 406 of the center row 454 may alternate between two different shapes and/or different areas along the longitudinal axis 444.

In some implementations, the perforations 406 of the secondary rows 456 are the same in the direction of the longitudinal axis 444. For example, the perforations 406 of the secondary rows 456 may be all the same shape and size, such as illustrated in FIG. 5. In other implementations, the perforations 406 of the secondary rows 456 vary in the direction of the longitudinal axis 444. For example, the perforations 406 of the secondary rows 456 may alternate between two different shapes and/or different areas in the direction of the longitudinal axis 444.

In some implementations, the perforations 406 of the tertiary rows 458 are the same in the direction of the longitudinal axis 444. For example, the perforations 406 of the tertiary rows 458 may be all the same shape and size, such as illustrated in FIG. 5. In other implementations, the perforations 406 of the tertiary rows 458 vary in the direction of the longitudinal axis 444. For example, the perforations 406 of the tertiary rows 458 may alternate between two different shapes and/or different areas in the direction of the longitudinal axis 444.

The perforations 406 of the center row 454 and secondary rows 456 may be the same. In other implementations, the perforations 406 of the center row 454 and secondary rows 456 may be different. For example, the perforations 406 of the center row 454 in FIG. 5 are oval and have a smaller area than the circular perforations 406 of the secondary rows 456 that flank the center row 454. The secondary rows 456 have perforations that vary in both shape and size from the center row 454.

The perforations 406 of the tertiary rows 458 may be the same as the center row 454 and/or the secondary rows 456, or the perforations 406 of the tertiary rows 458 may be different from those of both the center row 454 and the secondary rows 456. For example, all of the perforations 406 of the center row 454, secondary rows 456, and tertiary rows 458 may be the same. The implementation illustrated in FIG. 5, however, has perforations 406 of the tertiary rows 458 that are of different shape and size from the center row 454 and of different size but the same shape as the secondary rows 456.

Figure 6:
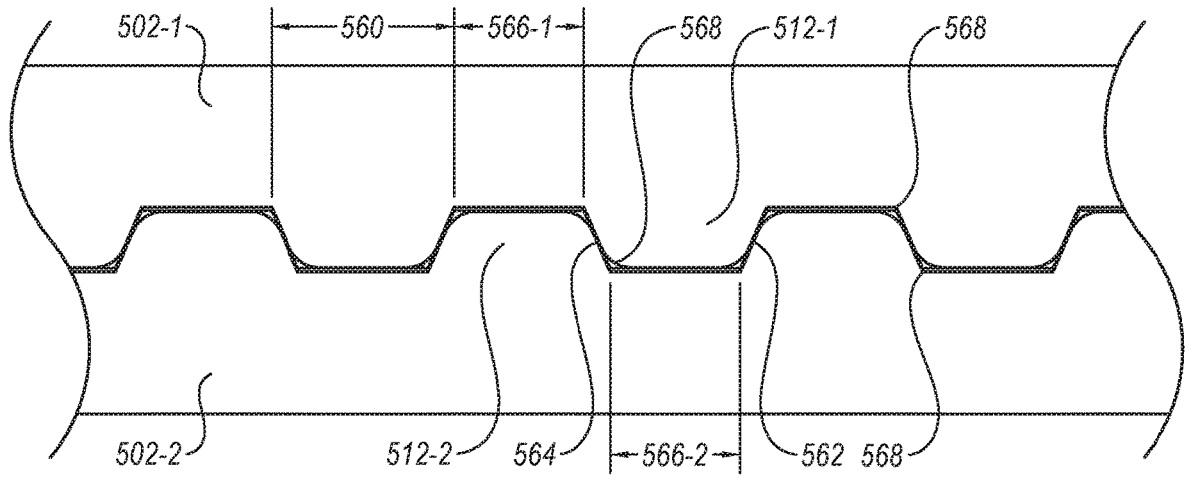
FIG. 6 is a detail view of alignment features.

FIG. 6 is a detail view of complementary alignment features 512-1, 512-2 that engage when the chassis in the closed state. In some implementations, the first alignment features 512-1 of the first portion 502-1 and/or the second alignment features 512-2 are symmetrical in the axial direction 560. For example, each of the first alignment features 512-1 may have a first face 562 and a second face 564 that are oriented at the same angle relative to the axial direction 560. A higher angle relative to the axial direction 560 can produce greater resistance to relative movement of the first portion 502-1 and second portion 502-2 in the axial direction 560 (i.e., increasing three-point bending strength of the chassis). A lower angle relative to the longitudinal direction can provide more reliable alignment and engagement between the first portion 502-1 and second portion 502-2 during closure of the chassis.

In some implementations, the first face 562 and/or second face 564 are oriented at an angle relative to the axial direction 560 in a range having an upper value, a lower value, or upper and lower values including any of 20°, 30°, 40°, 45°, 50°, 60°, 70°, 80°, 90°, or any values therebetween. For example, the first face 562 and/or second face 564 may be oriented at an angle relative to the axial direction 560 greater than 20°. In other examples, the first face 562 and/or second face 564 may be oriented at an angle relative to the axial direction 560 less than 90°. In yet other examples, the first face 562 and/or second face 564 may be oriented at an angle relative to the axial direction 560 between 20° and 90°. In further examples, the first face 562 and/or second face 564 may be oriented at an angle relative to the axial direction 560 between 30° and 70°. In at least one example, the first face 562 and/or second face 564 may be oriented at an angle relative to the axial direction 560 about 45°. In at least another example, the first face 562 and/or second face 564 may be oriented at an angle relative to the axial direction 560 about 65°.

In other implementations, the first alignment features 512-1 and/or the second alignment features 512-2 are asymmetrical in the axial direction 560. For example, the chassis may experience greater forces applied in a known or expected orientation during use or transport. In such instances, it may be desirable to have a first face 562 oriented at a lower (i.e., shallower) angle relative to the axial direction 560 and a second face 564 oriented at a higher (i.e., steeper) angle relative to the axial direction 560. The shallower first face 562 and steeper second face 564, in combination with complementary faces of the second alignment features 512-2, may allow more flex of the chassis in a first direction of torque and provide more rigidity in a second direction of torque on the chassis.

In some implementations, the first alignment features 512-1 of the first portion 502-1 are the same as the second alignment features 512-2 of the second portion 502-2 with an offset in the axial direction 560. In other implementations, the first alignment features 512-1 and the second alignment features 512-2 and/or the spacings therebetween are different. For example, the first alignment features 512-1 and the second alignment features 512-2 may be complementary while the first alignment features 512-1 are longer in the axial direction 560 with shorter first recesses 566-2 positioned between the first alignment features 512-1, and the second alignment features 512-2 are shorter in the axial direction 560 (to mate with the first recesses 566-1) with longer second recesses 566-2 (to mate with the first alignment features 512-1).

A tight fit of the alignment features 512-1, 512-2 with contact along a majority of the surface of the first alignment features 512-1 and the second alignment features 512-2 may allow for greater strength, as well as improved electrical conductivity between the first portion 502-1 and second portion 502-2 of the chassis. Greater electrical conductivity through the chassis and around an interior space may provide a better gaussian cage and increase the EMI shielding of the chassis.

In some implementations, the first alignment features 512-1 and/or the second alignment features 512-2 have gaps 568 at the corners. For example, the corners of the first alignment features 512-1 and/or the second alignment features 512-2 may be rounded, while the corners of the first recesses 566-1 and second recesses 566-2 are angular, resulting in gaps 568 between the first alignment features 512-1 and the second alignment features 512-2 when the chassis is in the closed state. The gaps 568 can provide tolerances for machining or manufacturing accuracy. The gaps 568 can allow the majority of the edges of the first alignment features 512-1 and the second alignment features 512-2 to contact, even if debris or flash remains on the edges. The gaps 568 can allow improved contact between the first alignment features 512-1 and/or the second alignment features 512-2, such that the chassis can provide EMI shielding without a bridging conductive element, such as copper tape, connecting the first portion 502-1 to the second portion 502-2.

Figure 7:
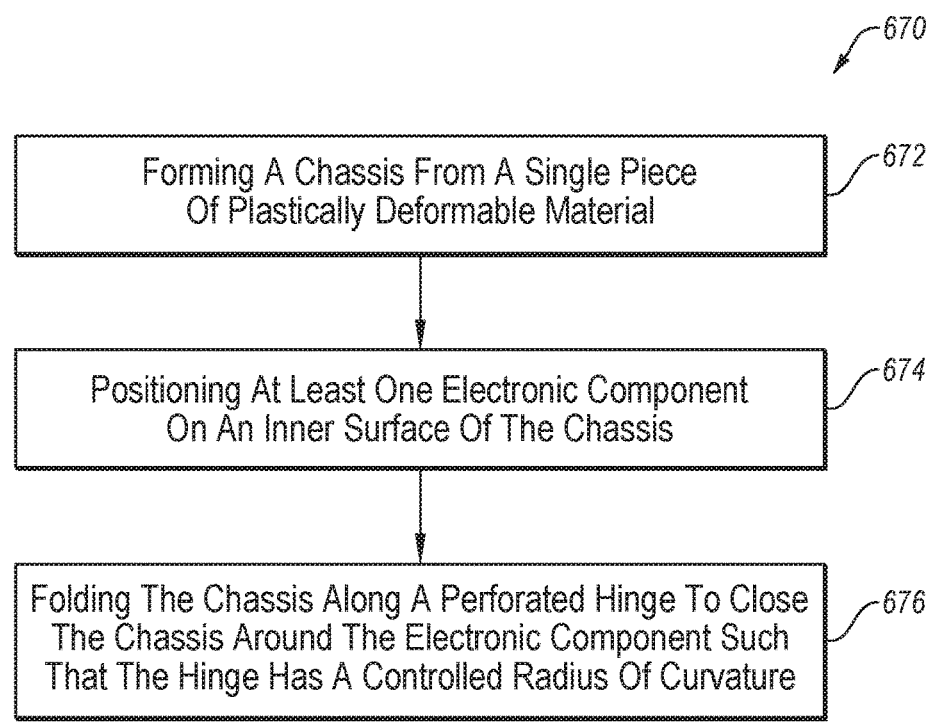
FIG. 7 is a flowchart illustrating a method of manufacturing an electronic device.

FIG. 7 is a flowchart illustrating an implementation of a method 670 of manufacturing an electronic device. The method 670 includes forming a chassis from a single piece of deformable material at 672.

In some implementations, the chassis is formed from a plastically deformable material, such as a steel alloy, an aluminum alloy, a titanium alloy, or other plastically deformable metals. The chassis may be stamped from a single sheet of material. For example, the perforations, bosses, alignment features, connection features, or combinations thereof may be stamped from a single sheet of deformable material.

In other implementations, the chassis in the open state is formed by removing material from a billet, such as by mechanical machining, water jet, laser, or other cutting technique. For example, it may be difficult to an efficiently stamp the chassis from an elastically deformable material, while the elastically deformable material may be machinable.

In yet other implementations, the single piece of material is additively manufactured by bonding a plurality of pieces together to form the chassis. For example, the chassis may be formed by bonding a metal powder through laser melting or laser sintering. In other examples, a plurality of pieces may be integrally bonded by welding to form a single continuous piece of material.

The method 670 further includes positioning at least one electronic component on an inner surface of the chassis at 674 and then folding the chassis along a perforated hinge to close the chassis around the electronic component such that the hinge has a controlled radius of curvature at 676. A controlled radius of curvature is any hinge that produces a repeatable curvature or cross-sectional shape based on the material and the geometry of the perforations. For example, a controlled radius of curvature may be a uniform radius of curvature. In other examples, a controlled radius of curvature may be a uniform radius of curvature may be a decreasing radius of curvature. In yet other examples, a controlled radius of curvature may be a parabolic radius of curvature.

Figures 1, 8:
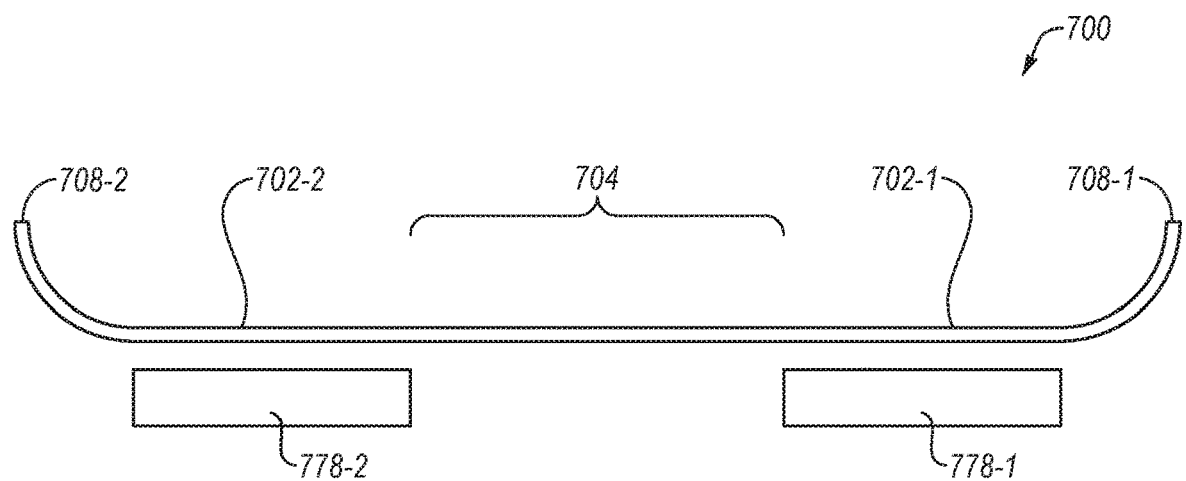
Figures 2, 8:
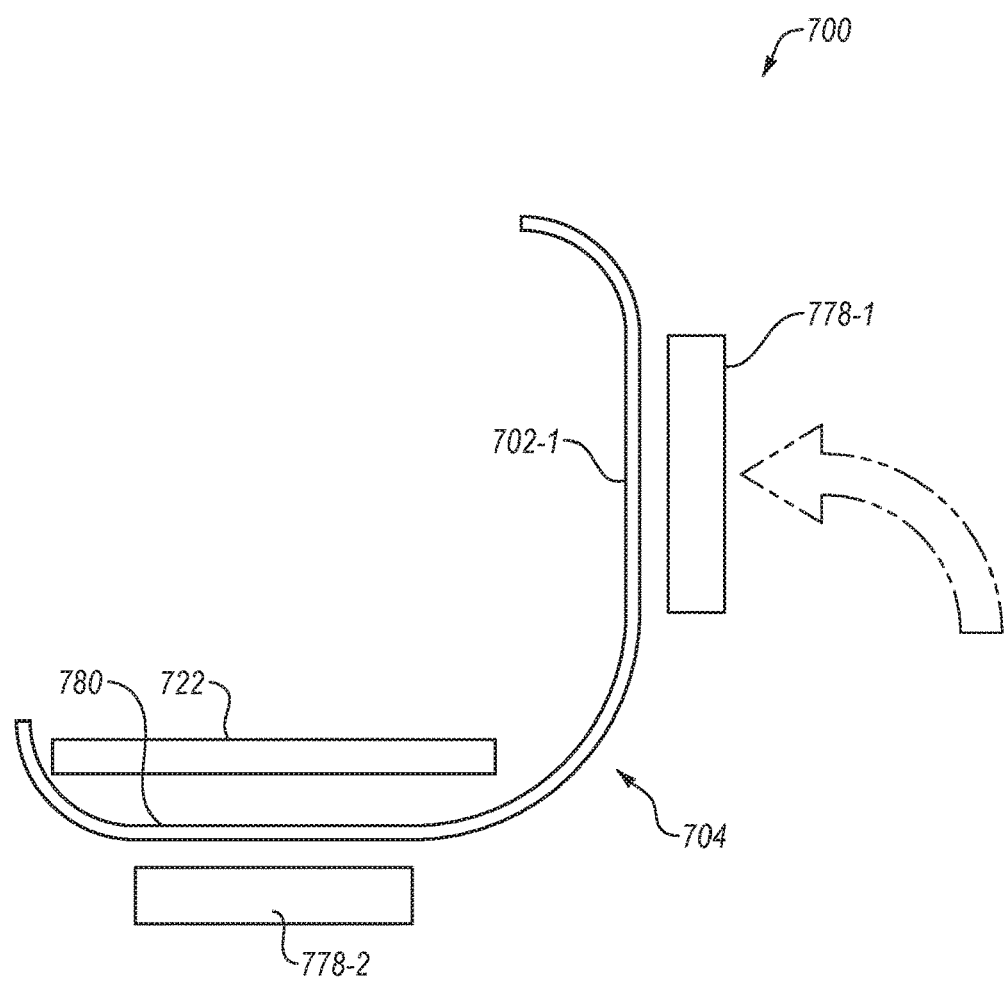
Figures 3, 8:
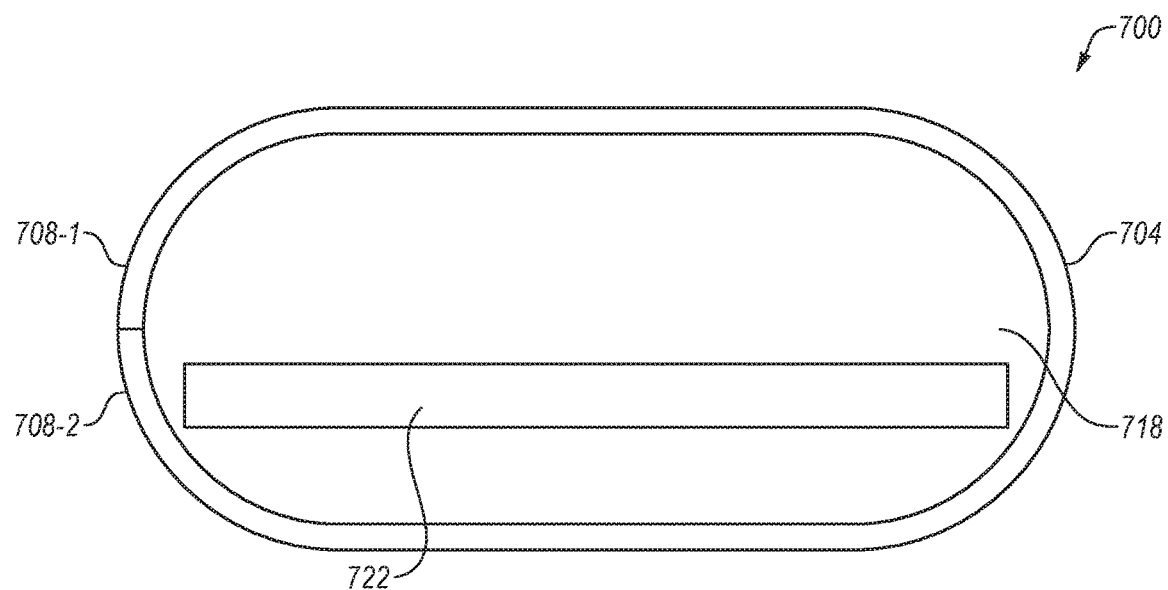

FIG. 8-1 through FIG. 8-3 illustrate the folding of a chassis. FIG. 8-1 is an end view of a chassis 700 positioned on a press having a first plate 778-1 and a second plate 778-2. The first plate 788-1 and second plate 788-2 are movable relative to one another to fold the first portion 702-1 of the chassis 700 toward the second portion 702-2 around the sheet metal bend that will form the hinge 704. As the first portion 702-1 folds toward the second portion 702-2, the hinge 704 deforms with a controlled radius of curvature such that the first outer edge 708-1 moves toward the second outer edge 708-2.

FIG. 8-2 is an end side view of the chassis 700 and plates 778-1, 778-2 of FIG. 8-1 midway through folding the chassis 700. An electronic component, such as a PCB 722, is positioned on an inner surface 780 of the chassis 700 as the first portion 702-1 is folded over the second portion 702-2 by the first plate 788-1 and second plate 788-2 moving relative to one another. Folding the chassis 700 allows for electronic components to be positioned in the chassis even if the electronic component is too large to be inserted axially into the chassis 700 in the closed state. For example, a plurality of electronic components can be placed on the inner surface 780 and arranged such that the electronic components at least partially support one another when the chassis 700 is closed.

A hinge 704 with a controlled radius of curvature allows the chassis 700 to be folded without a mandrel placed inside the sheet metal bend that forms the hinge 704. For example, a conventional hinge uses a press to wrap the chassis around a mandrel to form the curve of the hinge, and the mandrel is then removed. A hinge 704 may fold in a controlled manner without a mandrel, allowing electronic components to be positioned inside the hinge during folding, instead of the space being occupied by the mandrel.

FIG. 8-3 is an end view of the chassis 700 of FIGS. 8-1 and 8-2 in a closed state. The first outer edge 708-1 and second outer edge 708-2 are contacting and the PCB 722 is positioned in the interior space 718 defined by the chassis 700. The hinge 704 of the illustrated implementation in FIG. 8-3 has a uniform radius of curvature. In other implementations, the hinge 704 has a parabolic radius of curvature, decreasing radius of curvature, or other controlled radius of curvature.

Figure 9:
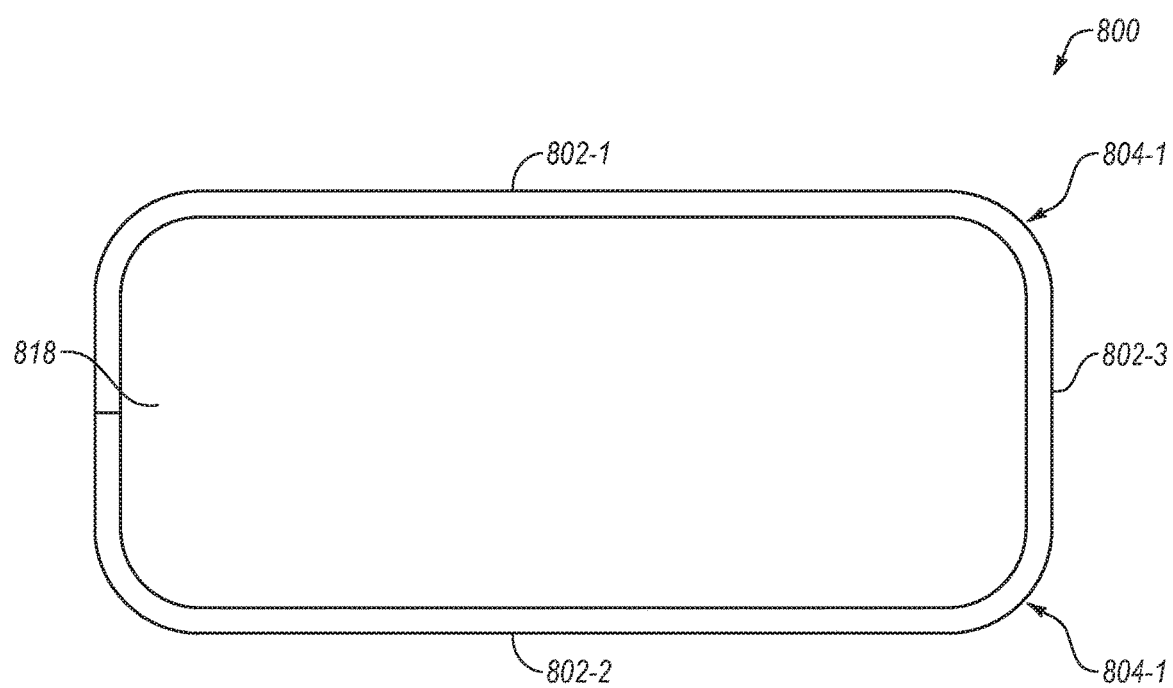
FIG. 9 is an end view of another chassis with a plurality of hinges.

FIG. 9 is an end view of another chassis 800. While chassis are described herein including a hinge connecting a first portion to a second portion, it should be understood that a chassis 800 may have a plurality of hinges 804-1, 804-2 positioned between a first portion 802-1 and a second portion 802-2 to allow a chassis 800 and/or interior space 818 that is a rounded rectangle in end view. For example, the width of the rounded rectangle may be defined by the first portion 802-1 and second portion 802-2 of the chassis 800, while a height of the rounded rectangle may be defined by a third portion 802-3 of the chassis 800 that is positioned between a first hinge 804-1 (between the first portion 802-1 and the third portion 802-3) and a second hinge 804-2 (between the second portion 802-2 and the third portion 802-3). In such implementations, each hinge 804-1, 804-2 may have a controlled radius of curvature, a uniform surface stress, a uniform internal stress, or combinations thereof, as described herein.

When in the closed state, residual stress in the hinge (i.e., elastic deformation) may apply an expansion force to urge the first portion 802-1 away from the second portion 802-2. In some implementations, the expansion force is less than 5 Newtons (N). In other implementations, the expansion force is less than 2.5 N. In yet other implementations, the expansion force is less than 1.0 N.

A chassis with one or more perforated hinges, in at least implementation, allow chassis to have uniform stress in the hinge. In at least one implementation, the hinge has a uniform radius of curvature. In other implementations, the hinge has a controlled radius of curvature that is parabolic, linearly decreasing, or other non-uniform shape. In yet other implementations, the chassis has a plurality of hinges that provide a generally rounded rectangular, rounded triangular, or other rounded polygonal shape in profile.

One or more specific implementations of the present disclosure are described herein. These described implementations are examples of the presently disclosed techniques. Additionally, in an effort to provide a concise description of these implementations, not all features of an actual implementation may be described in the specification. It should be appreciated that in the development of any such actual implementation, as in any engineering or design project, numerous implementation-specific decisions will be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one implementation" or "an implementation" of the present disclosure are not intended to be interpreted as excluding the existence of additional implementations that also incorporate the recited features. For example, any element described in relation to an implementation herein may be combinable with any element of any other implementation described herein. Numbers, percentages, ratios, or other values stated herein are intended to include that value, and also other values that are "about" or "approximately" the stated value, as would be appreciated by one of ordinary skill in the art encompassed by implementations of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to implementations disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the implementations that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described implementations are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. An electronic device, the device comprising:
a chassis having an open state and closed state, the chassis including:
a first portion having a first outer edge and a first inner edge;
a second portion having a second outer edge and a second inner edge; and
a perforated hinge including a plurality of perforations, the perforated hinge positioned between the first portion and the second portion at the first inner edge and the second inner edge, where the first portion, the second portion, and the perforated hinge are integrally formed from a continuous piece and the perforated hinge is deformable to mate the first outer edge to the second outer edge in the closed state, the perforated hinge having uniform internal stress in the closed state, the internal stress varying by less than 10% across at least 90% of the area of the perforated hinge.

2. The device of claim 1, the perforated hinge having a first axial row of perforations and a second axial row of perforations, the first axial row and the second axial row at least partially overlapping in a lateral direction.

3. The device of claim 1, one or more of the plurality of perforations being guitar-pick shaped.

4. The device of claim 1, one or more of the plurality of perforations being polygonal.

5. The device of claim 1, one or more of the plurality of perforations varying in shape.

6. The device of claim 1, one or more of the plurality of perforations varying in area.

7. The device of claim 1, a majority of the perforated hinge having a uniform radius of curvature in the closed state about a longitudinal axis of the perforated hinge.

8. The device of claim 1, the perforated hinge having uniform surface stress in the closed state, the surface stress varying by less than 10% across at least 90% of the area of the perforated hinge.

9. The device of claim 1, the first outer edge and second outer edge having complementary connection features.

10. The device of claim 1, the first portion including one or more mechanical supports proud from an inner surface of the first portion.

11. The device of claim 1, the chassis applying less than 5 Newtons of expansion force in the closed state.

12. The device of claim 1, the perforated hinge having uniform internal stress in the closed state, the internal stress varying by one or more of less than 10% across at least 95% of the area of the perforated hinge, less than 10% across the entire area of the perforated hinge, less than 5% across at least 90% of the area of the perforated hinge, less than 1% across at least 90% of the area of the perforated hinge 104, less than 5% across at least 95% of the area of the perforated hinge, or less than 5% across the entire area of the perforated hinge.

13. An electronic device, the device comprising:
 a chassis having an open state and closed state, the chassis including:
  a first portion having a first outer edge and a first inner edge;
  a second portion having a second outer edge and a second inner edge; and
  a perforated hinge including a plurality of perforations, the perforated hinge positioned between the first portion and the second portion at the first inner edge and the second inner edge, where the first portion, the second portion, and the perforated hinge are integrally formed from a continuous piece and the perforated hinge is deformable to mate the first outer edge to the second outer edge in the closed state, wherein the plurality of perforations are configured to allow the hinge to deform more easily than the rest of the chassis, the perforated hinge having uniform surface stress in the closed state, the surface stress varying by less than 10% across at least 90% of the area of the perforated hinge.

14. The device of claim 13, the perforated hinge having uniform internal stress in the closed state, the internal stress varying by less than 10% across at least 90% of the area of the perforated hinge.

15. The device of claim 13, a majority of the perforated hinge having a uniform radius of curvature in the closed state about a longitudinal axis of the perforated hinge.

16. The device of claim 13, the perforated hinge having uniform surface stress in the closed state, the surface stress varying by less than 10% across at least 90% of the area of the perforated hinge.

17. The device of claim 13, the perforated hinge having uniform internal stress in the closed state, the internal stress varying by less than 10% across at least 90% of the area of the perforated hinge.

18. The electronic device of claim 13, wherein the plurality of perforations include a plurality of struts between the plurality of perforations.

19. The electronic device of claim 13, wherein the plurality of struts define a strut width that is the same between each of the plurality of perforations along a longitudinal axis of the hinge.

20. The electronic device of claim 13, wherein the plurality of perforations are positioned such that a portion of the plurality of perforations overlap in a lateral direction.

21. The electronic device of claim 20, wherein the plurality of perforations include a plurality of axial rows of perforations each of which overlap the longitudinal axis, such that at least a portion of each of the plurality of perforations laterally overlaps another portion of the axially neighboring plurality of perforations.

22. An electronic device, the device comprising:
 a chassis having an open state and closed state, the chassis including:
  a first portion having a first outer edge and a first inner edge;
  a second portion having a second outer edge and a second inner edge; and
  a perforated hinge including a plurality of perforations, the perforated hinge positioned between the first portion and the second portion at the first inner edge and the second inner edge, where the first portion, the second portion, and the perforated hinge are integrally formed from a continuous piece and the perforated hinge is deformable to mate the first outer edge to the second outer edge in the closed state, wherein the plurality of perforations are configured to allow the hinge to deform more easily than the rest of the chassis, a majority of the perforated hinge having a uniform radius of curvature in the closed state about a longitudinal axis of the perforated hinge, the perforated hinge having uniform surface stress in the closed state such that the surface stress varies by less than 10% across at least 90% of the area of the perforated hinge, and the perforated hinge having uniform internal stress in the closed state such that the internal stress varies by less than 10% across at least 90% of the area of the perforated hinge.

\* \* \* \* \*